(12) United States Patent
Gupta

(10) Patent No.: US 9,020,449 B2
(45) Date of Patent: Apr. 28, 2015

(54) SOFTWARE-DEFINED RADIO WITH BROADBAND AMPLIFIERS AND ANTENNA MATCHING

(71) Applicant: Newlans, Inc., Acton, MA (US)

(72) Inventor: Dev V. Gupta, Concord, MA (US)

(73) Assignee: Newlans, Inc., Acton, MA (US)

( * ) Notice: Subject to any disclaimer, the term of this patent is extended or adjusted under 35 U.S.C. 154(b) by 0 days.

(21) Appl. No.: 14/384,899

(22) PCT Filed: Mar. 13, 2013

(86) PCT No.: PCT/US2013/030852
§ 371 (c)(1),
(2) Date: Sep. 12, 2014

(87) PCT Pub. No.: WO2013/138457
PCT Pub. Date: Sep. 19, 2013

(65) Prior Publication Data
US 2015/0072740 A1 Mar. 12, 2015

Related U.S. Application Data

(60) Provisional application No. 61/653,016, filed on May 30, 2012, provisional application No. 61/611,327, filed on Mar. 15, 2012.

(51) Int. Cl.
*H04B 1/44* (2006.01)
*H03G 3/30* (2006.01)
*H04B 1/00* (2006.01)
(Continued)

(52) U.S. Cl.
CPC .......... *H03G 3/3042* (2013.01); *H04B 1/0003* (2013.01); *H04B 1/0458* (2013.01); *H04B 1/18* (2013.01); *H04B 1/525* (2013.01)

(58) Field of Classification Search
CPC ........ H04B 1/48; H04B 1/525; H04B 1/0021; H04B 1/04; H04B 1/40; H04B 1/44; H04B 2001/0416; H04B 2001/045; H04B 5/0012; H04B 5/0081
USPC .......................................................... 455/78
See application file for complete search history.

(56) References Cited

U.S. PATENT DOCUMENTS 6,477,148 B1 * 11/2002 Gardenfors et al. .......... 370/280
7,269,144 B2    9/2007 Gärdenfors et al.
(Continued)

OTHER PUBLICATIONS

International Search Report and Written Opinion of the International Searching Authority mailed Jun. 27, 2013 from International Application No. PCT/US2013/030852, "Software-Defined Radio With Broadband Amplifiers And Antenna Matching," filed Mar. 13, 2013.

*Primary Examiner* — Ajibola Akinyemi
(74) *Attorney, Agent, or Firm* — Knobbe, Martens, Olson & Bear, LLP

(57) ABSTRACT

Mobile phone handsets include a CMOS front end configured for operating across multiple transmit and receive frequencies. The front end typically includes multiple receivers, each covering a different band allocated for cellular service, and requires large, expensive and power-intensive A/D converters and DSPs. Front-end circuits disclosed herein operate with a broadband software-defined radio (SDR), and include a receive Low Noise Amplifier (LNA), transmit Power Amplifier (PA), and an antenna matching network. The front-end provides broadband operation using relatively low power, and minimizes noise in the received signal.

20 Claims, 6 Drawing Sheets

(51) Int. Cl.
*H04B 1/04* (2006.01)
*H04B 1/18* (2006.01)

(56) References Cited

U.S. PATENT DOCUMENTS 8,412,136 B2 * 4/2013 Sivadas et al. ............ 455/127.1
2004/0048591 A1 * 3/2004 Kim et al. ................. 455/168.1
2009/0141829 A1   6/2009 Feher
2009/0323856 A1 * 12/2009 McCallister .................. 375/296
2010/0008338 A1   1/2010 Tsfati et al.
2010/0182090 A1   7/2010 Yang et al.
2010/0329234 A1  12/2010 Akbari
2011/0267144 A1 * 11/2011 Behera et al. ............... 330/260

* cited by examiner

SOFTWARE-DEFINED RADIO WITH BROADBAND AMPLIFIERS AND ANTENNA MATCHING

RELATED APPLICATIONS

This application is the U.S. National Stage of International Application No. PCT/US2013/030852, filed Mar. 13, 2013, which designates the U.S., published in English, and claims the benefit of U.S. Provisional Application No. 61/611,327, filed on Mar. 15, 2012, and U.S. Provisional Application No. 61/653,016, filed on May 30, 2012. The entire teachings of the above applications are incorporated herein by reference in its entirety as though fully set forth herein.

BACKGROUND

A typical mobile phone handset includes a CMOS front end configured for operating with 3G or 4G transmit and receive frequencies. It contains four receivers, each covering a band allocated for cellular service. The two transmitters cover the corresponding bands. Beyond telecommunications transceivers, the phone typically contains separate Bluetooth, WiFi and GPS receivers, which add significantly to cost and consume a substantial amount of power. To address this problem, recently released front-end integrated circuits (ICs) include integrated GPS and WiFi transceivers. However, even with integrated receivers, front end ICs still require large, expensive and power intensive A/D converters and DSPs. Among the deficiencies of this architecture, it is not adaptive to new frequency allocations. New front end ICs must be developed to incorporate hardware changes to receiver and transmitter structures as services and frequency allocations evolve. Moreover, devices are unable to operate across different standards/geographies without redundant hardware, and adding incremental receiver and transmitter structures increases power consumption and cost.

As high data rate services become ubiquitous, power consumption and cost will increase greatly, as the digital components required for such services are prohibitively expensive and draw down power quickly. In a market calling for efficiency and low cost, the current mobile handset architecture is pushing the technology in the opposite direction.

SUMMARY

Example embodiments of the invention include a circuit operable as a front-end of a software-defined radio. The circuit may include a transmit path connecting a transceiver to an antenna and a receive path connecting the transceiver to the antenna, where the receive path may be coupled to the transmit path at a common node. A power amplifier (PA) may be coupled to the transmit path and may be configured to amplify a transmit signal from the transceiver and output an amplified transmit signal to the antenna. Further, a differential low noise amplifier (LNA) may be coupled to the receive path. The differential LNA may be configured to output an amplified received signal based on receipt of a received signal from the antenna and a signal corresponding to the transmit signal.

In further embodiments, the signal corresponding to the transmit signal may be an equalized transmit signal. The circuit may further include a receive detector, a feedback circuit, and a controller coupled to the feedback circuit. The receive detector may be configured to detect noise at an output of the differential LNA. The feedback circuit configured to output the equalized transmit signal to the differential LNA. The controller may be configured to adjust at least one of a gain and a phase of the equalized transmit signal based on an output of the receive detector. The circuit may further include a transmit detector, which is configured to detect the transmit signal, where the controller adjusts at least one of the gain and the phase of the equalized transmit signal based on the output of the transmit detector. A pre-amplifier may also be coupled to the transmit path, the transmit detector being coupled to the transmit path between the pre-amplifier and the PA.

In still further embodiments, the differential LNA may operate to cancel a component of the received signal corresponding to the transmit signal, resulting in the amplified received signal being absent of noise corresponding to the transmit signal. The LNA may also operate in a common-mode rejection mode, and may comprise a plurality of amplifiers configured in a parallel cascade.

In yet still further embodiments, the PA may comprise a pre-amplifier, a plurality of amplifier stages configured in parallel, a plurality of baluns, and an impedence transformer. Each amplifier stage may receive an output of the pre-amplifier, and each balun may be a current-mode balun coupled to an output of a respective one of the plurality of amplifier stages. The impedance transformer may be configured to receive a combined output of each of the baluns, the impedance transformer outputting the amplified transmit signal.

In further embodiments, the circuit may include an antenna matching network coupled to the transmit path, the antenna matching network operating to cancel, from the amplified transmit signal, a reactive component of an impedance of the antenna. The network may adjust a power of the amplified transmit signal based on the reactive component of the impedance of the antenna. The network may further include first and second controllers, where the first controller adjusts a variable resistor based on the transmit signal, the variable resistor being coupled to the transmit path prior to the PA. The second controller may adjust a reactive tank based on the amplified transmit signal, the reactive tank being coupled to the transmit path between the PA and the antenna. The reactive tank may include at least one element having at least one of an adjustable capacitance and an adjustable impedance. In further embodiments, a conductive channel comprises the common mode and portions of the transmit and receive path coupling the PA and LNA, the conductive channel having a length configured to minimize a reflection of the received signal.

BRIEF DESCRIPTION OF THE DRAWINGS

The foregoing will be apparent from the following more particular description of example embodiments of the invention, as illustrated in the accompanying drawings and appended slides in which like reference characters refer to the same parts throughout the different views. The drawings are not necessarily to scale, emphasis instead being placed upon illustrating embodiments of the present invention.

DETAILED DESCRIPTION

A description of example embodiments of the invention follows. The teachings of all patents, published applications and references cited herein are incorporated by reference in their entirety.

Embodiments of the present invention may be implemented in a broadband software-defined radio (SDR). The SDR may include a radio-frequency (RF) front-end portion and a transceiver portion. The RF front-end, in example embodiments described below, includes a receive Low Noise Amplifier (LNA), transmit Power Amplifier (PA), and an antenna matching network. The transceiver may be coupled to the RF front-end and performs up-conversion and filtering of transmit signals, as well as filtering and down-conversion of received signals.

Figure 1:
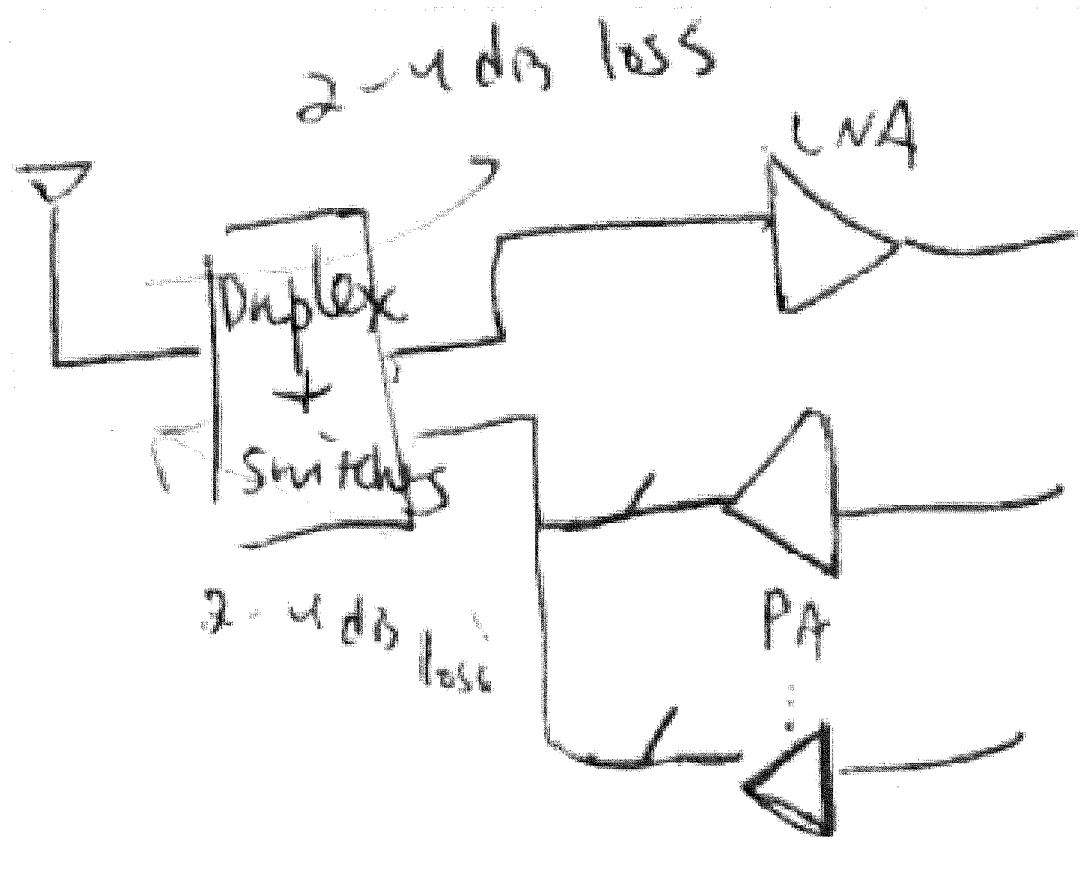
FIG. 1 is a block diagram of a prior art radio-frequency (RF) front-end.

FIG. 1 is a block diagram of a radio-frequency (RF) front-end 200 as known in the art. The front-end 200 includes a plurality of PAs for transmitting signals to an antenna, and an LNA for receiving signals from the antenna. A duplexer switching network connects the PAs and LNA to the antenna, enables switching among the PAs, and isolated the PAs from the LNA. Because no individual one of the PAs is able to operate over a broad frequency range (i.e., broadband operation, such as a 700 MHz-2.7 GHz range present in the long-term evolution (LTE) standard), several PAs must be included, and a duplexing switch is required to select among the PAs for a given bandwidth.

The duplexer switching network causes 2-4 dB of loss at both the transmit and receive chains. As a result of this loss, the LNA receives a signal with substantially less (e.g., half) power, and the transmit PA must apply substantially more power (e.g., double) to the output signal toward the antenna.

Figure 2:
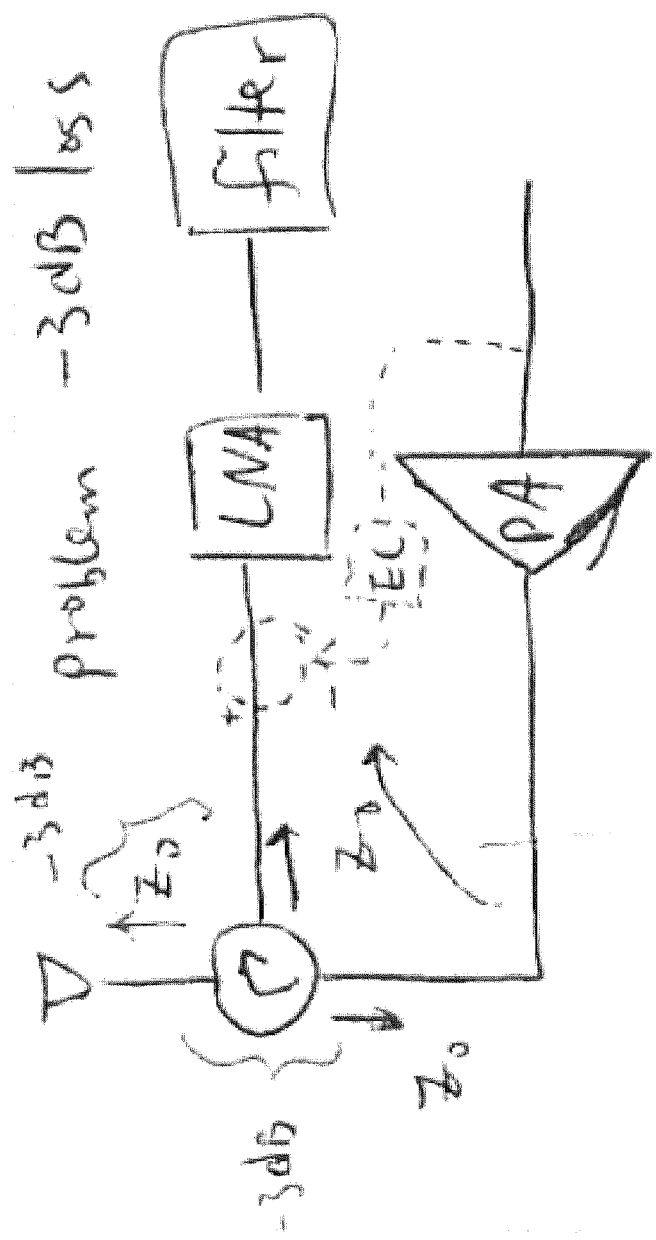
FIG. 2 is a block diagram of an RF front-end including an echo canceller and circulator.

FIG. 2 is a block diagram of an RF front-end 210 including an echo canceller and circulator. In contrast to the RF front-end 200 of FIG. 1, the front-end 210 includes a broadband echo-canceling filter, such as a continuous-time FIR transversal filter. This filter could be tuned under software control to cancel transmit echoes. Further, the duplexer switching network is replaced with a broadband circulator or balanced hybrid, providing greater Tx/Rx isolation on the order of 20 dB or less. This replacement may be possible due to the use of a broadband PA in place of a plurality of narrow-band PAs. An example broadband PA is described below with reference to FIG. 4. However, the front-end 210 is still susceptible to 3 dB loss, through the circulator, at both the transmit and receive chains.

Figure 3:
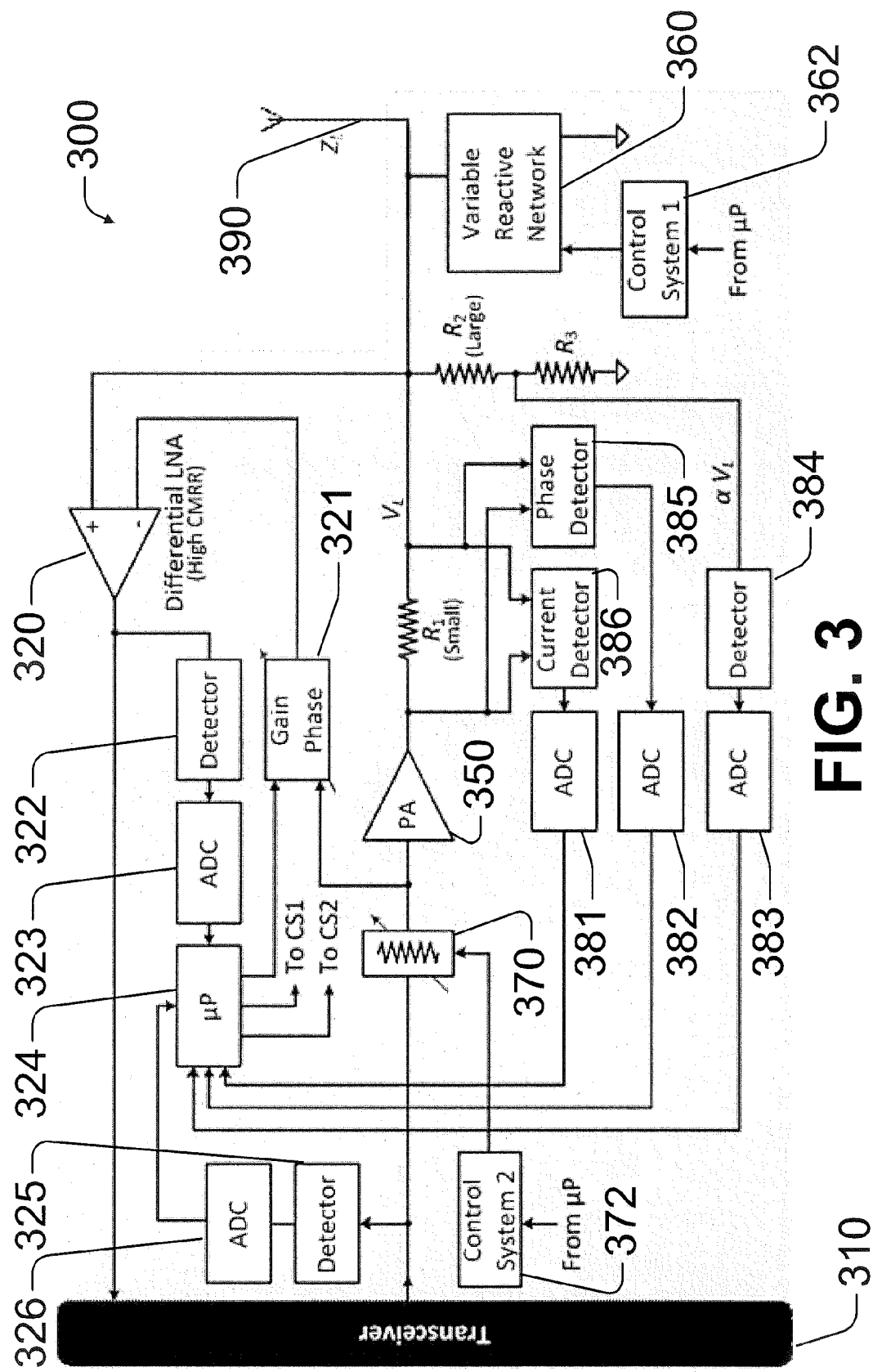
FIG. 3 is a block diagram of a software-defined radio (SDR) RF front-end in one embodiment of the invention.

FIG. 3 is a block diagram of a software-defined radio (SDR) RF front-end 300 in one embodiment of the invention. The front-end 300 is coupled to a transceiver 310 and facilitates transmission and reception of signals to and from an antenna 390. A PA 350 in the transmission path from the transceiver 310 amplifies transmit signals toward the antenna 390, while a differential LNA 320 amplifies received signals from the antenna 390 on the receive path toward the transceiver 310.

The RF front-end 300 overcomes problems exhibited by the front-ends 200, 210 described above through a number of features. In particular, 1) the LNA 320 may be configured to provide broadband operation and echo cancellation, 2) the PA 350 is configured to operate over a broad frequency range, and 3) an antenna-matching network 360 maximizes power transfer between the PA 350 and antenna 390. As a result, a duplexer switching network or circulator/balanced hybrid may be omitted, and only a single PA is required. Elimination of a circulator is also enabled by configuring a short transmission line between the transmit and receive chains, so as not to cause a reflection of the RF signal. Each of the above features is described in further detail below.

The LNA 320 employs echo cancelation via a variable gain and group delay equalizer 321 (or feedback circuit), which cancels the transmit signal from the LNA 320 output by feeding its equalized version to the negative terminal of the LNA 320. Thus, the common mode rejection ratio (CMRR) of the differential LNA 320 prevents the high transmit signal from reach the output of the LNA 320, while the receive signal, being differential, is amplified by the gain of the LNA 320. Noise from the PA 350 is also cancelled in this process, and thus the effective noise figure (NF) of the receiver path is well-maintained. The gain and group delay of the equalizer 321 are control of the microprocessor 324, and are adjusted until the power is minimized. To provide this adjustment, a detector 320 detects the LNA 320 output and forwards it to the microprocessor 324 via an analog-to-digital converter (ADC) 323, with values adjusted until a minimum is achieved (following toggling around the minimum). The microprocessor 324 may also control the equalizer 321 based on a pre-amplified transmit signal from the transceiver 310 prior to amplification by the PA 350, as provided by a detector 325 and ADC 326. As a result, transmit noise cancelation may also be achieved.

The LNA 320 may be configured having a distributed structure to enable the transmitted and power amplified signal at the receiver to become common-mode. For example, the LNA 320 may be structured as a parallel cascade of N individual LNAs of lower power ("LNTs," not shown) to form a summing LNA. The received signal from the antenna 390 may be divided into N voltage-scaled signals prior to input to the LNA 320, each scaled signal being fed to an LNT. The outputs of the LNTs may then be summed to provide a single differential output signal to the detector 322. Each LNT may therefore provide a respective rail-to-rail common mode range. The LNTs have a high common-mode rejection ratio (CMRR), low noise (e.g., less than 3 dB), and operate to cancel transmit leak as well as any noise put out by the pre-amplifier (located at the transceiver 310 or in the transmit path prior to the PA 350). By summing the outputs of the LNTs, the LNA 320 provides an output having an amplified received signal with echo cancellation and minimal noise from the transmit path.

Figure 4:
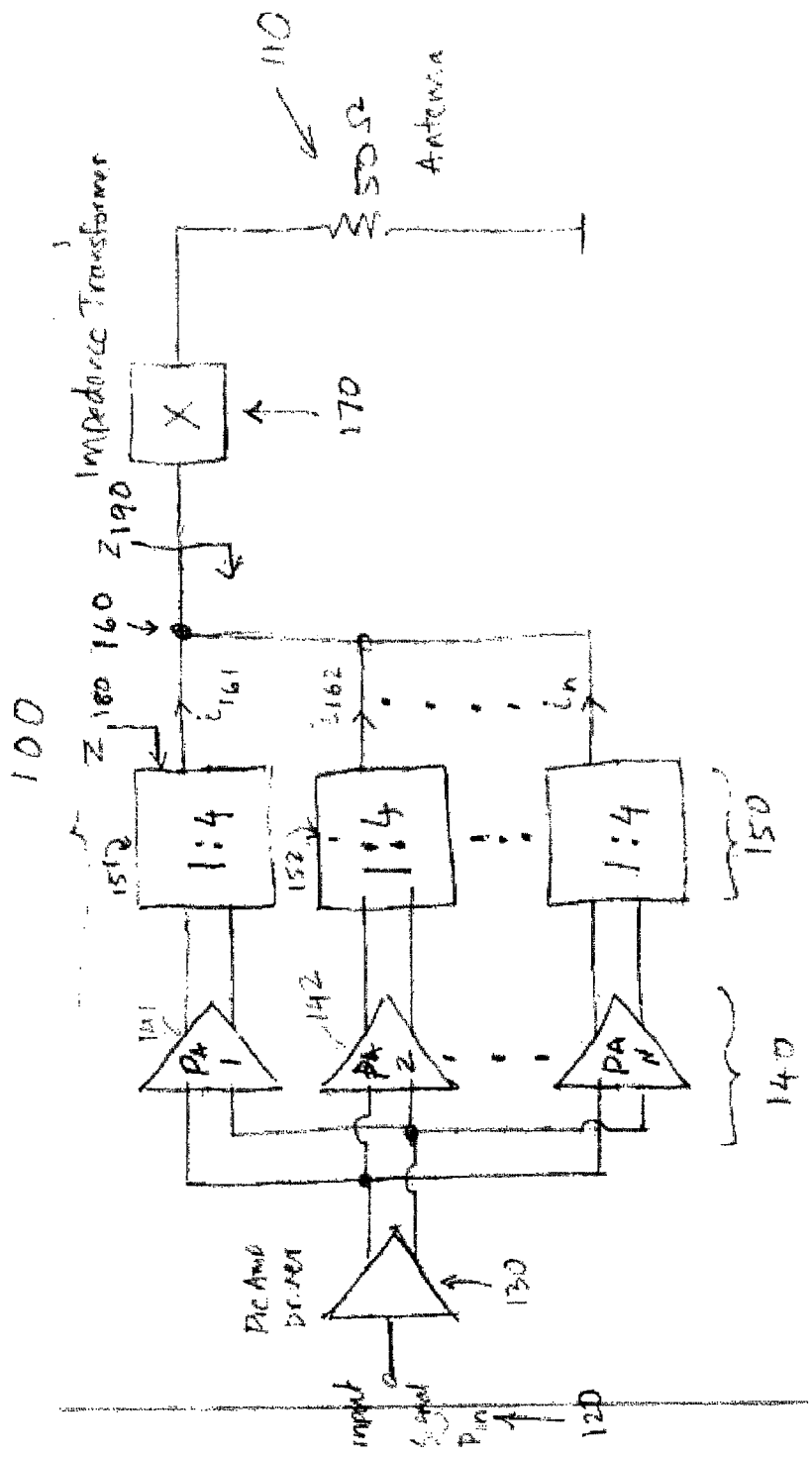
FIG. 4 is a block diagram of a power amplifier in one embodiment of the invention.

FIG. 4 is a block diagram of a power amplifier (PA) 100, which may be implemented as the PA 350 in the RF front-end 300 of FIG. 3. Medium power (~1 W) power amplifiers for handset applications have so far been dominated by GaAs semiconductor technology, due to superior high frequency operation and power handling capability of GaAs (III-V) semiconductors. However, due to the nature of these devices and its fabrication technology, only N-type devices can be built. This limitation has meant that only simple single-ended amplifier structures can be built using this technology. In addition, amplifier structures built using GaAs technology have input and output impedances that contain large reactive components, which require a matching circuit to present a real impedance (e.g., 50 ohm) to the outside world. These matching circuits are typically narrow band structures, which are insufficient for broadband applications.

CMOS technology advancements at smaller semiconductor nodes have increased the maximum operating frequency of the devices to be useful as amplifiers at the RF/Cellular frequency range, but this improvement has come at the limitation of maximum output voltage and power available per device. For example, to generate a 250 mW RF signal into a 50 ohm load requires devices capable of generating >3.5V rms. This requirement is higher than what can be generated from submicron CMOS processes. For example, a 65 nm GP node at TSMC (a semiconductor foundry) is capable of producing 65 nm 1.2V devices with very high frequency performance, but a limited output voltage. Larger, 280 nm devices having higher voltage capability of 2.5V can also be built, but such devices suffer from degraded high frequency performance. While 3.3V devices can be employed, even though such devices are incapable of generating the output power required for the aforementioned application. Therefore, although existing devices may be capable of broadband amplification, the power output of such devices may not be acceptable in handset RF front-end applications.

Previous applications have employed techniques such as a distributed active transformer (DAT), which combines the output power of multiple devices to generate the required output power. Such power amplifiers typically use "voltage" amplifiers as building blocks and used tranformers (DAT being one implementation) to generate an output signal.

The PA 100 of FIG. 4, in contrast, may be considered to operate as a "current" mode power amplifier. The PA 100 is configured to amplify an input signal 120 and generate the required amount of power into a load impedance, such as a 50 ohm antenna 110. The amplifier 100 may include a pre-amplifier/driver 130, one or more current mode power amplifier stages built from operational transconductance amplifiers (OTAs) 140, one or more current mode baluns (e.g., "Guanella baluns") 150, the outputs of which are summed at a node 160, and an impedance transformer 170 that matches the PA 100 output impedance to that of the load $Z_L$ of the antenna 110.

Each of the power amplifier stages 141, 142, etc. may be a low voltage (e.g., 3.3V) OTA capable of outputting a fraction of the required output current (i.e. a fraction of the total required power at a voltage of, say, $V_a$). A number of PA stages 141, 142 may be included as needed to generate the required total power, each providing a balanced/differential current output. A balun stage 150 is used to convert the balanced current outputs to an unbalanced output current. Each balun 151, 152, etc. may operate in current mode. The unbalanced currents 161, 162, etc. from the balun are summed together at a current summing node 160. Guanella baluns indicate wide frequency range of operation making them suitable for wideband applications such as this. Although typical Guanella baluns may have a 1:1 impedance ratio between balanced and unbalanced ends but can also be designed for other fixed ratios, say 1:4, as shown in the figures (above). The differential output impedance of each PA section ($Z_a$) is thus transformed to a singled ended current output stage with an impedance (Z180). As described earlier, all the current outputs which are similarly converted to singled ended output currents (i161, i162 etc) are summed together at the summing node 160. The effective impedance at the combined output Z190 is therefore a fraction of the individual impedances at each balun 150 output. Current-mode baluns may also provide a measure of isolation between the summing node 160 and the outputs of the PA stage 140, which is beneficial in isolating the PAs 140 from the load and from one another.

This output impedance Z180 of the current-mode PA may then be adjusted to the required antenna impedance (100 $Z_L$) by an impedance transformer 170 (the voltage at the antenna being $V_L$). The impedance transformer 170 can be wideband (e.g., covering a 2-octave range of 700 MHz to 2800 MHz) using transmission line structures. Alternatively, wideband impedance-transforming structures based on a current-mode or Guanella balun can also be substituted.

The broadband PA 100 therefore covers a wide frequency band of operation (e.g., cellular bands between 700 MHz and 2700 MHz), and overcomes the limited power/voltage output capability of submicron CMOS processes by utilizing a current mode of operation. In a specific example, the output impedance of each PA stage $Z_a$<the antenna load impedance $Z_L$ and $V_a$<$V_L$.

Figure 5A:
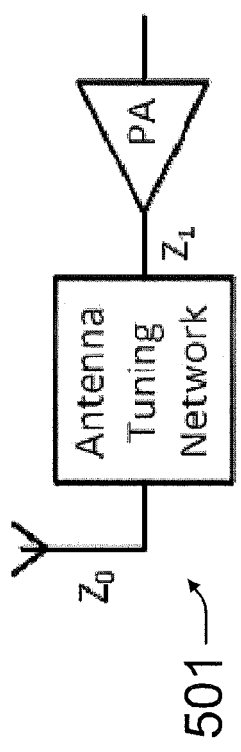
FIGS. 5A-5B are block diagrams of antenna-matching networks in one embodiment of the invention.
Figure 5B:
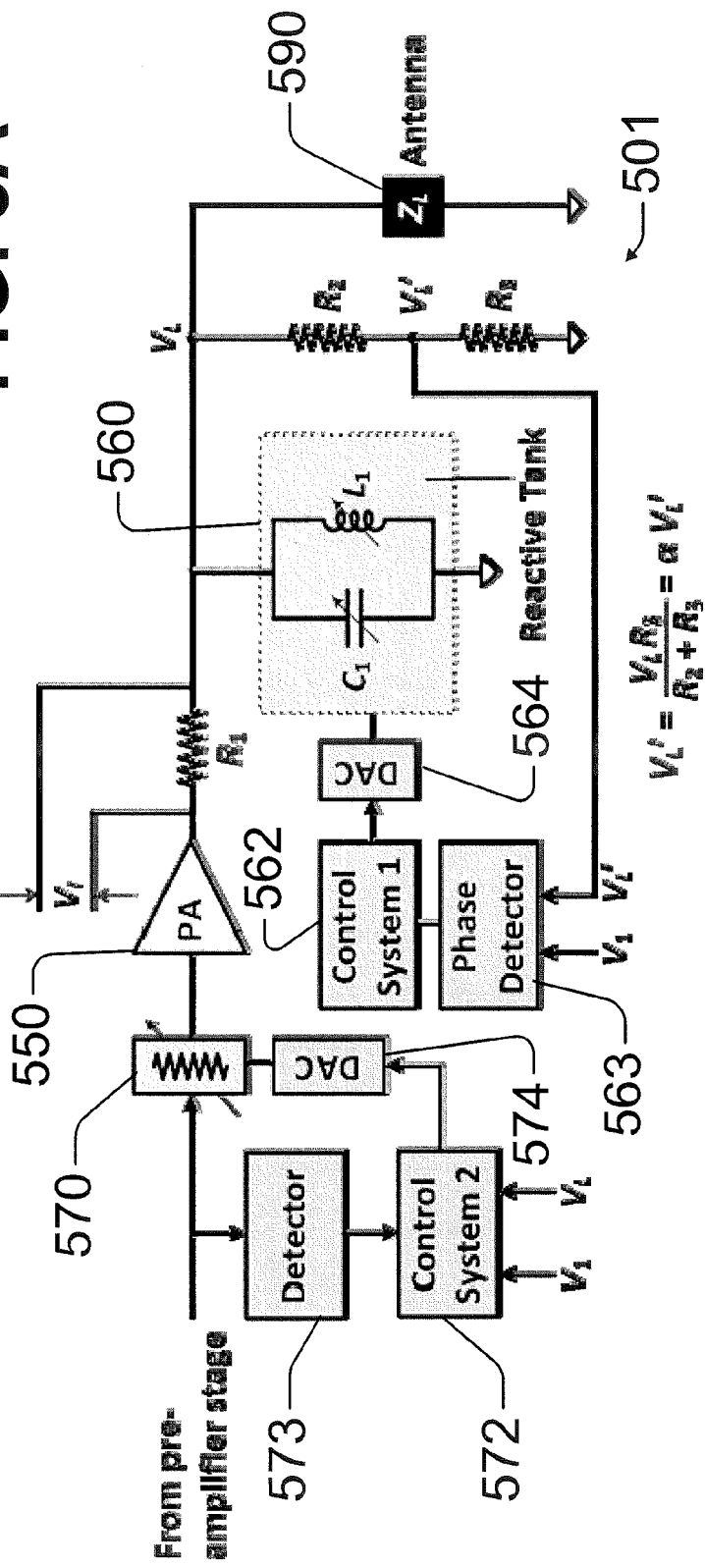

FIGS. 5A-B are block diagrams of antenna-matching networks in one embodiment of the invention. FIG. 5A shows a simplified block diagram of a an antenna-matching network 501, while FIG. 5B is a circuit diagram of a specific implementation of the antenna-matching network 501. One goal of an antenna matching network is to maximize transfer of power from the power amplifier to the antenna. Referring to FIG. 5A, the antenna impedance $Z_0$ varies in time and, therefore, the task of the antenna matching network 501 is to provide a dynamic impedance matching the power amplifier and antenna over time. Typical matching circuits employ banks of reactive elements that are switched in or out by a switch, which is constructed from solid state or MEMS devices. Such architectures have difficulties relating to narrow bandwidth, high insertion loss and high voltage.

Turning to FIG. 5B, the antenna-matching network 501 operates to: 1) cancel the reactive component of the antenna impedance, $Z_L$ 590, in real time and over broad bandwidth; and 2) adjust the transmit power such that required power delivered to the real components of $Z_L$ 590 is equal to the power that would have been delivered had Re[$Z_L$] been equal to a pre-defined ideal value (e.g., 50Ω).

The value of resistor $R_1$ may be chosen to be small when compared to Re[$Z_L$]. The voltage Vi is therefore a measure of the current from the power amplifier (PA) 550. Voltage $V_L'=\alpha V_L$ is a measure of the voltage across the load $Z_L$. the phase of which is detected by the phase detector 563. Thus, control system 1 562, via the DAC 564, tunes the reactive tank 560 until $V_i$ and $V_L$ are in phase (i.e. there is reactive power). At this point, the reactance of the load is cancelled by the reactance of the tank. As the power amplifier 550 is putting out real power, it is going into the Re[$Z_L$] part of the load because the reactive tank 560 and the load's reactance cannot consume real power.

The output voltage of the detetctor 573 is proportional to the power into the power amplifier. Control System 2 572 measures this power with the power into the load, which is obtained from $V_L$ (voltage across the load) and $V_i$ (measure of the current into the load). Control System 2 572, via the DAC 574, adjusts the broadband variable attenuator 570 until the power into the Re[$Z_L$] is equal to the power that would have been delivered into a pre-defined ideal resistance (normally 50Ω).

The disclosed transmit and receive filtering and up and down conversion are implemented through the method defined within U.S. patent application Ser. No. 13/175,260, the entirety of which is incorporated herein by reference. This disclosure defines post-LNA receive filtering and pre-PA transmit filtering using WiSP technology, as well as methods for up-conversion and down-conversion. Optionally, the WiSP anti-aliasing filters defined can precede up-conversion and follow down-conversion.

Figure 6:
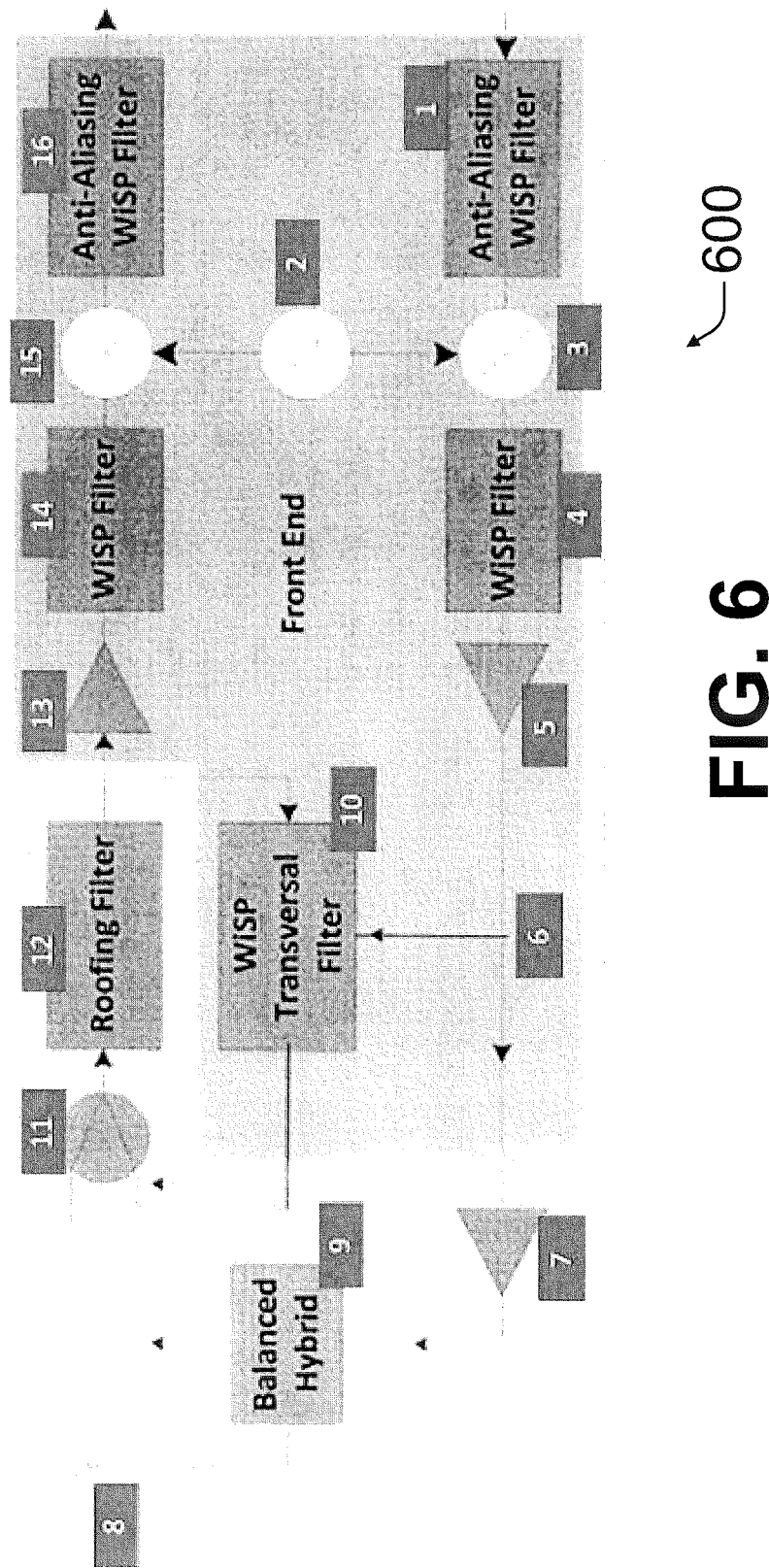
FIG. 6 is a block diagram of a SDR front-end in which embodiments of the present invention may be incorporated.

FIG. 6 is a block diagram of a SDR front-end in which embodiments of the present invention may be incorporated. The front end may be implemented on a CMOS and SiGe device for low transmit power levels. For high transmit power levels, some components may be located off-chip. Embodiments of the SDR front end can be configured for use in a software defined radio, a spectrum analyzer, an early warning radar system, or in any other application where wideband filtering and signal processing is required. Other embodiments can be used in handsets for cellular telephone use. Operation of the front end is described below.

In the transmit path, an anti-aliasing filter 1 receives an input signal from a digital-to-analog converter (DAC) or I/Q DACSs (not shown). The output from the anti-aliasing filter drives an up-converter mixer 3 where the local oscillator frequency is provided by a frequency synthesizer 2. A programmable band pass filter 4 rejects unwanted sideband and harmonic content from the output of the upconverter 3. The passband characteristics of this filter can be changed under software control such that it offers low loss insertion loss to the transmit frequency, which is determined by the synthesizer 2. The output of the bandpass filter 4 drives an amplifier driver 5, which typically operates in the linear region and, therefore, does not contribute to the spectral regrowth or non-linearization of the amplifier driver. The output from the amplifer driver 5 drives the power amplifier 7, which may be implemented as a component external to the front end.

In the receive path, a low noise amplifier 13 is a wide band device that operates across the operating range of the SDR front end. A programmable bandpass filter 14 further reduces the bandwidth of the incoming signal to the channel bandwidth of the desired receive signal. A downconverter mixer 15 downconverts the incoming RF signal from the low noise amplifier 13 to base band. The local oscillator frequency is provided by the synthesizer 2. The programmable anti-aliasing filter 16 is a low pass filter, the filter transfer characteristics of which can be changed under software control based on data rate and presence of interferer in the base band. The filter 16 is provided to maximize the sensitivity of the analog-to-digital converter.

The architecture and operation of the components of the SDR front end of FIG. 6 are described in further detail in PCT Application PCT/US2011/024542, the entirety of which is incorporated herein by reference.

While this invention has been particularly shown and described with references to example embodiments thereof, it will be understood by those skilled in the art that various changes in form and details may be made therein without departing from the scope of the invention.

What is claimed is:

1. A circuit comprising:
   a transmit path connecting a transceiver to an antenna;
   a receive path connecting the transceiver to the antenna, the receive path coupled to the transmit path at a common node;
   a power amplifier (PA) coupled to the transmit path, the PA configured to amplify a transmit signal from the transceiver and output an amplified transmit signal to the antenna;
   a differential low noise amplifier (LNA) coupled to the receive path, the differential LNA configured to receive a received signal from the antenna and a signal corresponding to the transmit signal, the differential LNA outputting an amplified received signal, wherein the signal corresponding to the transmit signal is an equalized transmit signal;
   a receive detector configured to detect noise at an output of the differential LNA;
   a feedback circuit configured to output the equalized transmit signal to the differential LNA;
   a controller coupled to the feedback circuit, the controller configured to adjust at least one of a gain and a phase of the equalized transmit signal based on an output of the receive detector; and
   a transmit detector configured to detect the transmit signal, the controller further configured to adjust at least one of the gain and the phase of the equalized transmit signal based on the output of the transmit detector.

2. The circuit of claim 1, further comprising a pre-amplifier coupled to the transmit path, the transmit detector being coupled to the transmit path between the pre-amplifier and the PA.

3. The circuit of claim 1, wherein the differential LNA is further configured to cancel a component of the received signal corresponding to the transmit signal.

4. The circuit of claim 3, wherein the amplified received signal is absent of noise corresponding to the transmit signal.

5. The circuit of claim 1, wherein the differential LNA operates in a common-mode rejection mode.

6. The circuit of claim 1, wherein the LNA comprises a plurality of amplifiers configured in a parallel cascade.

7. The circuit of claim 1, further comprising an antenna matching network coupled to the transmit path, the antenna matching network configured to cancel, from the amplified transmit signal, a reactive component of an impedance of the antenna.

8. The circuit of claim 7, wherein the antenna matching network is further configured to adjust a power of the amplified transmit signal based on the reactive component of the impedance of the antenna.

9. The circuit of claim 1, wherein a conductive channel comprises the common mode and portions of the transmit and receive path coupling the PA and LNA, the conductive channel having a length configured to minimize a reflection of the received signal.

10. A circuit comprising:
    a transmit path connecting a transceiver to an antenna;
    a receive path connecting the transceiver to the antenna, the receive path coupled to the transmit path at a common node;
    a power amplifier (PA) coupled to the transmit path, the PA configured to amplify a transmit signal from the transceiver and output an amplified transmit signal to the antenna; and
    a differential low noise amplifier (LNA) coupled to the receive path, the differential LNA configured to receive a received signal from the antenna and a signal corresponding to the transmit signal, the differential LNA outputting an amplified received signal,
    wherein the PA further comprises:
       a pre-amplifier;
       a plurality of amplifier stages configured in parallel, each of the amplifier stages receiving an output of the pre-amplifier;
       a plurality of baluns, each balun coupled to an output of a respective one of the plurality of amplifier stages; and
       an impedance transformer configured to receive a combined output of each of the baluns, the impedance transformer outputting the amplified transmit signal.

11. The circuit of claim 10, wherein the signal corresponding to the transmit signal is an equalized transmit signal, and further comprising:
    a receive detector configured to detect noise at an output of the differential LNA;
    a feedback circuit configured to output the equalized transmit signal to the differential LNA; and
    a controller coupled to the feedback circuit, the controller configured to adjust at least one of a gain and a phase of the equalized transmit signal based on an output of the receive detector.

12. The circuit of claim 11, further comprising a transmit detector configured to detect the transmit signal, the controller further configured to adjust at least one of the gain and the phase of the equalized transmit signal based on the output of the transmit detector.

13. The circuit of claim 10, wherein the plurality of baluns are current-mode baluns.

14. The circuit of claim 10, wherein the signal corresponding to the transmit signal is an equalized transmit signal.

15. The circuit of claim 10, wherein the differential LNA is further configured to cancel a component of the received signal corresponding to the transmit signal.

16. The circuit of claim 10, further comprising an antenna matching network coupled to the transmit path, the antenna matching network configured to cancel, from the amplified transmit signal, a reactive component of an impedance of the antenna.

17. A circuit comprising:
   a transmit path connecting a transceiver to an antenna;
   a receive path connecting the transceiver to the antenna, the receive path coupled to the transmit path at a common node;
   a power amplifier (PA) coupled to the transmit path, the PA configured to amplify a transmit signal from the transceiver and output an amplified transmit signal to the antenna;
   a differential low noise amplifier (LNA) coupled to the receive path, the differential LNA configured to receive a received signal from the antenna and a signal corresponding to the transmit signal, the differential LNA outputting an amplified received signal; and
   an antenna matching network coupled to the transmit path, the antenna matching network configured to cancel, from the amplified transmit signal, a reactive component of an impedance of the antenna,
   wherein the antenna matching network comprises:
      a first controller configured to adjust a variable resistor based on the transmit signal, the variable resistor being coupled to the transmit path prior to the PA; and
      a second controller configured to adjust a reactive tank based on the amplified transmit signal, the reactive tank being coupled to the transmit path between the PA and the antenna.

18. The circuit of claim 17, wherein the reactive tank includes at least one element having at least one of an adjustable capacitance and an adjustable impedance.

19. The circuit of claim 17, wherein the signal corresponding to the transmit signal is an equalized transmit signal.

20. The circuit of claim 17, wherein the differential LNA is further configured to cancel a component of the received signal corresponding to the transmit signal.

* * * * *